(12) United States Patent
Liu et al.

(10) Patent No.: US 10,224,233 B2
(45) Date of Patent: Mar. 5, 2019

(54) HIGH RESISTIVITY SILICON-ON-INSULATOR SUBSTRATE COMPRISING A CHARGE TRAPPING LAYER FORMED BY HE-$N_2$ CO-IMPLANTATION

(71) Applicant: SunEdison Semiconductor Limited (UEN201334164H), Singapore (SG)

(72) Inventors: Qingmin Liu, Glen Carbon, IL (US); Robert Wendell Standley, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/526,864

(22) PCT Filed: Nov. 16, 2015

(86) PCT No.: PCT/US2015/060885
§ 371 (c)(1),
(2) Date: May 15, 2017

(87) PCT Pub. No.: WO2016/081367
PCT Pub. Date: May 26, 2016

(65) Prior Publication Data
US 2017/0358484 A1    Dec. 14, 2017

Related U.S. Application Data

(60) Provisional application No. 62/081,362, filed on Nov. 18, 2014.

(51) Int. Cl.
*H01L 21/762*    (2006.01)

(52) U.S. Cl.
CPC ............................ *H01L 21/76254* (2013.01)

(58) Field of Classification Search
CPC .................................................. H01L 21/76254
See application file for complete search history.

(56) References Cited

U.S. PATENT DOCUMENTS

| 4,501,060 A | 2/1985 | Frye et al. |
| 4,755,865 A | 7/1988 | Wilson et al. |

(Continued)

FOREIGN PATENT DOCUMENTS

| EP | 0939430 A2 | 1/1999 |
| EP | 1865551 A1 | 12/2007 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

(Continued)

*Primary Examiner* — Yasser A Abdelaziez
(74) *Attorney, Agent, or Firm* — Armstrong Teasdale LLP

(57) ABSTRACT

A multilayer composite structure and a method of preparing a multilayer composite structure are provided. The multilayer composite structure comprises a semiconductor handle substrate having a minimum bulk region resistivity of at least about 500 ohm-cm and comprises a region of nitrogen-reacted nanovoids in the front surface region; a silicon dioxide layer on the surface of the semiconductor handle substrate; a dielectric layer in contact with the silicon dioxide layer; and a semiconductor device layer in contact with the dielectric layer.

21 Claims, 3 Drawing Sheets

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 6,043,138 | A | 3/2000 | Ibok |
| 6,373,113 | B1 | 4/2002 | Gardner et al. |
| 6,562,127 | B1 | 5/2003 | Kud et al. |
| 6,624,047 | B1 | 9/2003 | Sakaguchi et al. |
| 7,868,419 | B1 | 1/2011 | Kerr et al. |
| 7,879,699 | B2 | 2/2011 | Bschulze et al. |
| 7,915,716 | B2 | 3/2011 | Pisigan et al. |
| 8,058,137 | B1 | 11/2011 | Or-Bach et al. |
| 8,076,750 | B1 | 12/2011 | Kerr et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 2002/0090758 | A1 | 7/2002 | Henley et al. |
| 2004/0005740 | A1 | 1/2004 | Lochtefeld et al. |
| 2004/0031979 | A1 | 2/2004 | Lochtefeld et al. |
| 2004/0108537 | A1 | 6/2004 | Tiwari |
| 2005/0153524 | A1 | 7/2005 | Maa et al. |
| 2005/0167002 | A1 | 8/2005 | Ghyselen et al. |
| 2006/0030124 | A1 | 2/2006 | Maa et al. |
| 2006/0033110 | A1 | 2/2006 | Alam et al. |
| 2006/0226482 | A1 | 10/2006 | Suvorov |
| 2007/0032040 | A1 | 2/2007 | Lederer |
| 2007/0054466 | A1 | 3/2007 | Hebras |
| 2009/0004833 | A1 | 1/2009 | Suzuki et al. |
| 2009/0014828 | A1 | 1/2009 | Mizushima et al. |
| 2009/0092810 | A1 | 4/2009 | Lee et al. |
| 2009/0321829 | A1 | 12/2009 | Nguyen et al. |
| 2011/0131542 | A1* | 6/2011 | Botula .................... H01L 21/84 716/136 |
| 2011/0174362 | A1 | 7/2011 | Tanner et al. |
| 2011/0298083 | A1 | 12/2011 | Yoneda |
| 2012/0091587 | A1 | 4/2012 | Or-Bach et al. |
| 2012/0161310 | A1 | 6/2012 | Brindle et al. |
| 2012/0238070 | A1 | 9/2012 | Libbert et al. |
| 2012/0267681 | A1 | 10/2012 | Nemoto et al. |
| 2013/0120951 | A1 | 5/2013 | Zuo et al. |
| 2013/0122672 | A1 | 5/2013 | Or-Bach et al. |
| 2013/0168835 | A1 | 7/2013 | Botula et al. |
| 2013/0193445 | A1 | 8/2013 | Dennard et al. |
| 2013/0294038 | A1 | 11/2013 | Landru et al. |
| 2013/0344680 | A1 | 12/2013 | Arriagada et al. |
| 2014/0042598 | A1 | 2/2014 | Kitada et al. |
| 2014/0070215 | A1 | 3/2014 | Bedell et al. |
| 2014/0084290 | A1 | 3/2014 | Allibert et al. |
| 2014/0120654 | A1 | 5/2014 | Fujii et al. |
| 2014/0124902 | A1 | 5/2014 | Botula et al. |
| 2014/0273405 | A1 | 9/2014 | Liu et al. |
| 2015/0004778 | A1 | 1/2015 | Botula et al. |
| 2015/0115480 | A1 | 4/2015 | Peidous et al. |

FOREIGN PATENT DOCUMENTS

| | | |
|---|---|---|
| EP | 2426701 A1 | 7/2012 |
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE international SOI Conference Proceedings, 2006, pp. 29-30.

Kerr, Daniel C., Identification of RF harmonic distortion of Si substrates arid its reduction using a trap-rich layer, IEEE (IEEE Topical Meeting), 2008, pp. 151-154.

Bucher, Adolph, Field-Effect arid Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5,3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructurel defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546vol. 72, No. 20.

International Search Report and Written Opinion of the International Searching Authority regarding PCT/US2015/060885 dated Jan. 26, 2016; 12 pgs.

* cited by examiner

HIGH RESISTIVITY SILICON-ON-INSULATOR SUBSTRATE COMPRISING A CHARGE TRAPPING LAYER FORMED BY HE-N$_2$ CO-IMPLANTATION

CROSS-REFERENCE TO RELATED APPLICATION

This application is a National Stage application of International Application No. PCT/US2015/060885, filed on Nov. 16, 2015. International Application No. PCT/US2015/060885 claims priority to U.S. provisional patent application Ser. No. 62/081,362 filed on Nov. 18, 2014. The disclosure of both priority documents are hereby incorporated by reference as if set forth in their entirety.

FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates, and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The wafers are then pressed together, and a bond is formed there between. This bond is relatively weak, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one method of creating a semiconductor-on-insulator structure 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf, pp.* 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerr et al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

SUMMARY OF THE INVENTION

The present invention is directed to a multilayer structure comprising: a single crystal semiconductor handle substrate comprising two major, generally parallel surfaces, one of which is a front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, a front surface region having a depth, D, as measured from the front surface and toward the central plane, and a bulk region between the front and back surfaces of the single crystal semiconductor handle substrate, wherein the single crystal semiconductor handle substrate has a minimum bulk region resistivity of at least about 500 ohm-cm and the front surface region comprises nitrogen-reacted nanovoids; a dielectric layer in contact with the front surface of the single crystal semiconductor handle substrate; and a single crystal semiconductor device layer in contact with the dielectric layer.

The present invention is further directed to a method of forming a multilayer structure. The method comprises oxidizing a front surface of a single crystal semiconductor handle substrate to thereby prepare a semiconductor oxide layer having a thickness, D1, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, a front surface region having a depth, D, as measured from the front surface and toward the central plane, and a bulk region between the front and back surfaces of the single crystal semiconductor handle substrate, wherein the single crystal semiconductor handle substrate has a minimum bulk region resistivity of at least about 500 ohm-cm; implanting He through the semiconductor oxide and the front surface of the single crystal semiconductor handle substrate to form an implant plane having a peak depth, D2, as measured from the front surface of the single crystal semiconductor substrate toward the central plane; implanting $N_2$ through the semiconductor oxide and the front surface of the single crystal semiconductor handle substrate to form an implant plane having a peak depth, D3, as measured from the front surface of the single crystal semiconductor substrate toward the central plane; heating the He and $N_2$ implanted single crystal semiconductor handle substrate at a temperature and a duration sufficient to out-diffuse He and thereby yield nanovoids in the front surface region of the single crystal semiconductor handle substrate; and bonding a dielectric layer on a front surface of a single crystal semiconductor donor substrate to the semiconductor oxide layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the front surface of the semiconductor donor substrate comprises the dielectric layer.

Other objects and features will be in part apparent and in part pointed out hereinafter.

DETAILED DESCRIPTION OF THE EMBODIMENT(S) OF THE INVENTION

Figure 1:
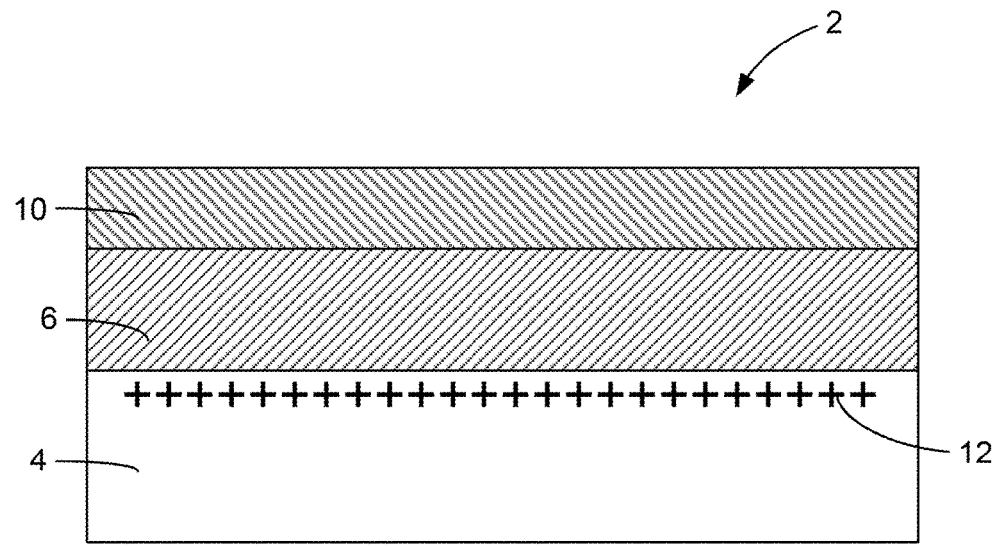
FIG. 1 is a depiction of a silicon-on-insulator wafer comprising a high resistivity substrate and a buried oxide layer.
Figure 2:
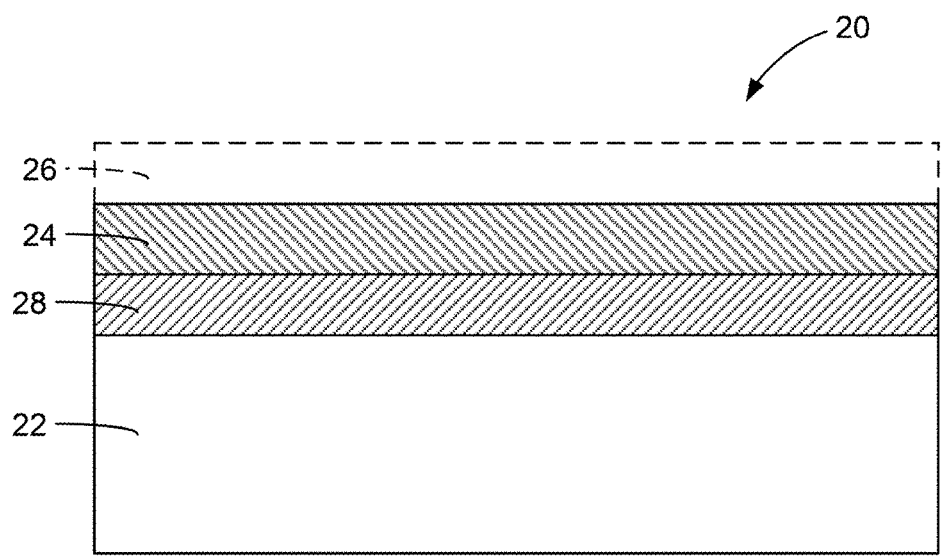
FIG. 2 is a depiction of a silicon-on-insulator wafer according to the prior art, the SOI wafer comprising a polysilicon charge trapping layer between a high resistivity substrate and a buried oxide layer.

According to the present invention, a method is provided for preparing a semiconductor-on-insulator composite structure comprising a charge trapping layer (CTL). The present invention is further directed to a semiconductor-on-insulator composite structure comprising a charge trapping layer (CTL). In some embodiments, the semiconductor-on-insulator (e.g., silicon-on-insulator) comprises a high resistivity handle substrate prepared by He—$N_2$ co-implantation and heat treatment to thereby form the charge trapping layer comprising a region of nanovoids. It has been discovered that a charge trapping layer prepared by He—$N_2$ co-implantation and heat treatment, and thus having nanovoids, may suppress the parasitic conduction phenomenon in HR-SOI wafers for RF applications. Co-implantation of He and $N_2$ followed by a heat treatment creates nanometer-size voids at the BOX/handle interface that are electrically activated deep level traps. He implantation followed by heat treatment causes He out-diffusion, which thereby forms nanovoids in the single crystal semiconductor (e.g. single crystal silicon) handle substrate. Nitrogen is co-implanted since nitrogen reacts with these voids and forms deep level trap states. With this method, there should be little or no surface roughening of the handle wafer, which reduces or eliminates the requirement for chemical mechanical polishing (CMP) prior to bonding.

According to the method of the present invention, in general, a high resistivity handle substrate (e.g., a silicon wafer having a resistivity>1 kΩ·cm) is processed in a vertical furnace to grow semiconductor oxide (e.g., silicon dioxide). After the oxidation, He and $N_2$ are implanted through the semiconductor oxide (e.g., silicon dioxide) and through the front surface of the handle substrate into a front surface region of the substrate (e.g., a silicon wafer having a resistivity>1 kΩ·cm). The implant depth is a little bit more than the thickness of the semiconductor oxide (e.g., silicon dioxide) so that the CTL forms in the front surface region of the handle substrate at the oxide/handle interface later. After the implantation, the wafer is thermal treated to let He out-diffused. After He is out-diffused, voids will be left in the front surface region at the oxide/handle interface. A conventional donor wafer can then be bonded to the handle substrate according to conventional methods. The semiconductor-on-insulator (e.g., silicon-on-insulator) structure is then heat treated, cleaved, and passes through multiple thermal processes to reach the end of line with standard process flow.

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. It is through this front surface that the He and $N_2$ are implanted into a front surface region of the single crystal semiconductor handle substrate. The front surface region of the single crystal semiconductor handle substrate may be defined by a depth, D, which is measured perpendicularly from the front surface of the substrate toward the central plane. In general, the depth, D, of the front surface region is less than about 1000 nanometers, such as less than about 500 nanometers, such as less than about 400 nanometers, or even less than about 300 nanometers. A "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure. The front surface of a single crystal semiconductor donor substrate often comprises a dielectric layer, e.g., a silicon dioxide layer, which forms the buried oxide (BOX) layer in the final structure. A "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., Handbook of Semiconductor Silicon Technology, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor wafers, i.e., handle wafer and donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Interstitial oxygen may be measured according to SEMI MF 1188-1105.

In some embodiments, the semiconductor handle substrate, e.g., a single crystal semiconductor handle substrate, such as a single crystal silicon handle wafer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments and with reference to FIGS. 3A through 3D, the front surface of the semiconductor handle wafer 102 (e.g., a silicon wafer) is oxidized to form a semiconductor oxide layer 104 (e.g., a silicon dioxide layer) on the front surface of the semiconductor handle wafer 102 in a first step for preparing a semiconductor-on-insulator structure (e.g., silicon-on-insulator) 100 comprising a single crystal semiconductor handle substrate 102, a semiconductor oxide (e.g., silicon dioxide) layer 104, and a single crystal semiconductor device layer 108. In order to form a semiconductor oxide layer 104 (e.g., a silicon dioxide layer), the front surface of the semiconductor handle wafer 102 is oxidized prior to implantation such that the He and $N_2$ implanted through the semiconductor oxide layer 104 (e.g., a silicon dioxide layer). This may be accomplished by means known in the art, such as thermal oxidation (in which some portion of the deposited semiconductor material film will be consumed) or CVD oxide deposition. In some embodiments, the single crystal semiconductor handle substrate, e.g., a single crystal silicon handle wafer, may be thermally oxidized in a furnace such as an ASM A400. The temperature may range from 750° C. to 1200° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In an exemplary embodiment, semiconductor handle wafer 102 may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace. In some embodiments, the semiconductor oxide layer 104 (e.g., a silicon dioxide layer), is formed on the front surface of the single crystal semiconductor handle substrate 102 to an average depth D1 between about 10 nanometers and about 5000 nanometers, such as between about 100 nanometers and about 1000 nanometers, or between about 200 nanometers and about 400 nanometers.

Figure 3A:
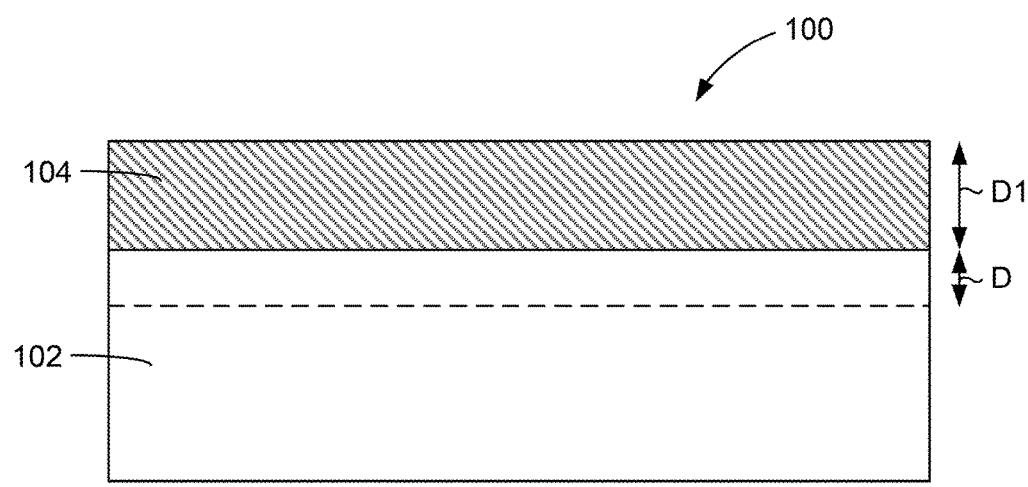
FIGS. 3A through 3D depict process steps according to the method of the present invention.
Figure 3B:
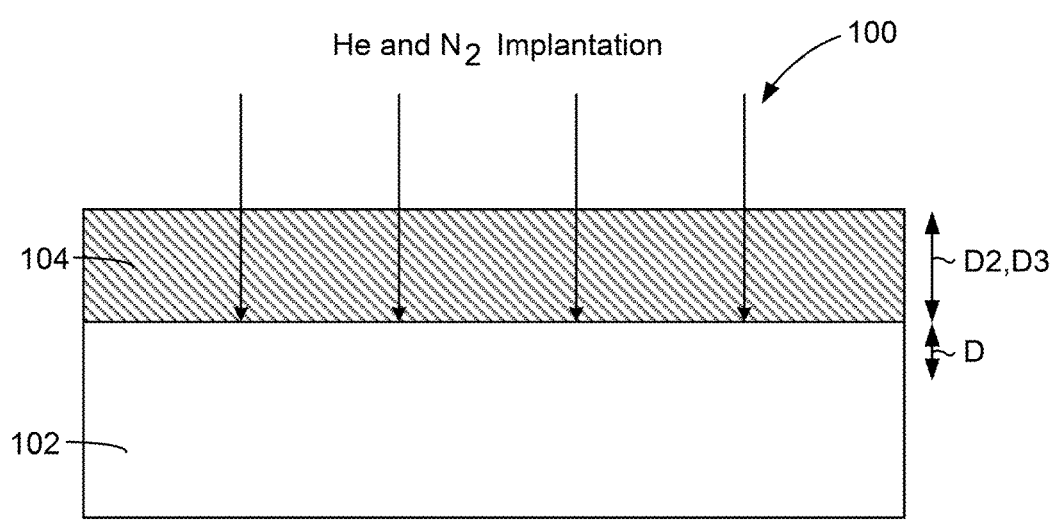

In some embodiments of the invention, and with reference to FIGS. 3A-3D, a method is provided for preparing a semiconductor-on-insulator structure (e.g., silicon-on-insulator) 100 comprising a single crystal semiconductor handle substrate 102, a semiconductor oxide layer 104 (e.g., a silicon dioxide layer), and a single crystal semiconductor device layer 108. The single crystal semiconductor handle substrate 102 comprises a high resistivity single crystal semiconductor wafer. For reference (and not to scale), a dashed line is provided in FIG. 3A and marked by the depth, D, which defines the front surface region of the single crystal semiconductor handle substrate 102. A semiconductor oxide layer 104 (e.g., a silicon dioxide layer) is formed on the front surface of the single crystal semiconductor handle substrate 102 as described above. With reference to FIG. 3B, He and $N_2$ are implanted through the front surface of the semiconductor oxide layer 104 (e.g., a silicon dioxide layer) to depths D2 and D3 just greater than the thickness of the semiconductor oxide layer 104 (e.g., a silicon dioxide layer).

The peak depth of He implantation may be denoted D2, and the peak depth of N implantation may be denoted D3. According to the method of the present invention, He is implanted through the front surface of the semiconductor oxide layer 104 (e.g., a silicon dioxide layer) to form an implant plane having a peak depth of He, D2, as measured from the front surface of the single crystal semiconductor substrate toward the central plane. According to the method of the present invention, $N_2$ is implanted through the front surface of the semiconductor oxide layer 104 (e.g., a silicon dioxide layer) to form an implant plane having a peak depth of $N_2$, D3, as measured from the front surface of the single crystal semiconductor substrate toward the central plane. According to some embodiments, He is implanted simultaneously with $N_2$. In some embodiments, He is implanted prior to $N_2$ implantation. In some embodiments, $N_2$ is implanted prior to He implantation. Preferably, the peak depths D2 and D3 are essentially equivalent to the thickness, D1, of the semiconductor oxide layer 104 (e.g., a silicon dioxide layer). That is, if a semiconductor oxide layer, e.g., a silicon dioxide layer, is grown to a depth of 300 nanometers, the peak depth of He and $N_2$ implantation is about 300 nanometers. In some embodiments, the peak depth D2 may be between about 10 nanometers and about 5000 nanometers, such as between about 100 nanometers and about 1000 nanometers, or between about 200 nanometers and about 400 nanometers, with the depths corresponding to the thickness, D1, of the semiconductor oxide layer. In some embodiments, the peak depth D3 may be between about 10 nanometers and about 5000 nanometers, such as between about 100 nanometers and about 1000 nanometers, or between about 200 nanometers and about 400 nanometers, with the depths corresponding to the thickness, D1, of the semiconductor oxide layer.

Ion implantation may be carried out in a commercially available instrument, such as an Applied Materials Quantum II. Ion implantation is carried out at a density and energy sufficient to implant He and N2 through the thickness, D1, of the semiconductor oxide layer 104 (e.g., a silicon dioxide layer) and into the front surface region (defined by depth, D) of the single crystal semiconductor handle substrate 102. He Implant density may range from about $1\times10^{14}$ ions/cm$^2$ to about $1\times10^{17}$ ions/cm$^2$, such as from about $1\times10^{15}$ ions/cm$^2$ to about $6\times10^{16}$ ions/cm$^2$. He implant energies may range from about 1 keV to about 3,000 keV, such as from about 50 keV to about 1,000 keV. $N_2$ implant density may range from about $1\times10^{12}$ ions/cm$^2$ to about $1\times10^{19}$ ions/cm$^2$, such as from about $1\times10^{13}$ ions/cm$^2$ to about $1\times10^{18}$ ions/cm$^2$. $N_2$ implant energies may range from about 1 keV to about 3,000 keV, such as from about 80 keV to about 1,000 keV. In some embodiments it may be desirable to subject the single crystal semiconductor handle substrate 102, e.g., single crystal silicon handle wafer, to a clean after the implant. In some preferred embodiments, the clean could include a Piranha clean followed by a DI water rinse and SC1/SC2 cleans.

Figure 3C:
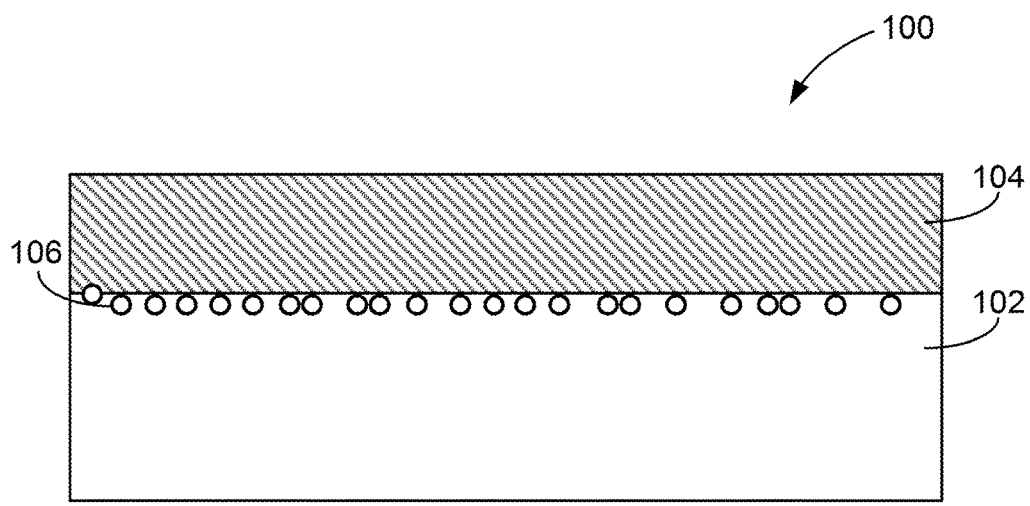

With reference to FIG. 3C, after ion implantation, the He and $N_2$ implanted single crystal semiconductor handle substrate 102 having a semiconductor oxide layer 104 (e.g., a silicon dioxide layer) is subjected to a thermal anneal to out-diffuse He and thereby leave a region of nitrogen-reacted nanovoids 106 near the interface of the high resistivity single crystal semiconductor handle substrate 102 and the semiconductor oxide layer 104 (e.g., a silicon dioxide layer). A conventional furnace, such as an ASM A 400, may be used for the thermal anneal. The temperature of the thermal anneal may range from about 700° C. to about 1200° C., and the duration may range from about 10 minutes to about 2 hours, such as between about 10 minutes and about 1 hour. He implantation followed by heat treatment causes He out-diffusion, which thereby forms a region of nanovoids 106 at the interface of the high resistivity single crystal semiconductor handle substrate 102 and the semiconductor oxide layer 104 (e.g., a silicon dioxide layer). Nitrogen is co-implanted since nitrogen reacts with these voids and forms deep level trap states. The concentration, i.e., surface density, of nanovoids at or near the oxide interface is preferably at least about $1\times10^{12}$ nanovoids/cm$^2$ in order to efficiently trap charges, preferably at least about $1\times10^{13}$ nanovoids/cm$^2$ or even at least about $1\times10^{14}$ nanovoids/cm$^2$. In some embodiments, the nanovoid region 106 comprises nanovoids at a surface density between about $1\times10^{12}$ nitrogen-reacted nanovoids/cm$^2$ and about $1\times10^{15}$ nitrogen-reacted nanovoids/cm$^2$. In some embodiments, the nanovoid region 106 comprises nanovoids at a surface density between about $1\times10^{13}$ nitrogen-reacted nanovoids/cm$^2$ and about $1\times10^{15}$ nitrogen-reacted nanovoids/cm$^2$. The nanovoid region 106 is generally a few nanometers thick, such as between 1 nanometer and about 1000 nanometers, or between about 10 nanometers and about 500 nanometers. A nanovoid region 106 having this density of nitrogen reacted nanovoids is sufficient to effectively trap charge.

After ion implantation and thermal treatment, wafer cleaning is optional. If desired, the wafers can be cleaned, for example, in a standard SC1/SC2 solution.

The high resistivity single crystal semiconductor handle substrate 102, e.g. a single crystal semiconductor handle wafer such as a single crystal silicon handle wafer, prepared according to the method described herein comprising a nanovoid region 106 in the front surface region of the high resistivity single crystal semiconductor handle substrate 102, and, optionally, an oxide film, is next bonded a semiconductor donor substrate, e.g., a single crystal semiconductor donor wafer, which is prepared according to conventional layer transfer methods. The single crystal semiconductor donor substrate may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer may comprise a dopant selected from the group consisting of boron, arsenic, and phosphorus. The resistivity of the single crystal semiconductor (e.g., silicon) donor wafer may range from 1 to 50 Ohm-cm, typically, from 5 to 25 Ohm-cm. The single crystal semiconductor donor wafer may be subjected to standard process steps including oxidation, implant, and post implant cleaning. Accordingly, a semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the semiconductor donor substrate comprises a dielectric layer. Suitable dielectric layers may comprise a material selected from among silicon dioxide, silicon nitride, hafnium oxide, titanium oxide, zirconium oxide, lanthanum oxide, barium oxide, and a combination thereof. In some embodiments, the dielectric layer comprises an oxide layer having a thickness of at least about 10 nanometer thick, such as between about 10 nanometers and about 10,000 nanometers, between about 10 nanometers and about 5,000 nanometers, or between about 100 nanometers and about 400 nanometers.

In some embodiments, the front surface of the single crystal semiconductor donor substrate (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate may be thermally oxidized in a furnace such as an ASM A400 in the same manner described above. In some embodiments, the donor substrates are oxidized to provide an oxide layer on the front surface layer of at least about 10 nanometer thick, such as between about 10 nanometers and about 10,000 nanometers, between about 10 nanometers and about 5,000 nanometers, or between about 100 nanometers and about 400 nanometers.

Ion implantation may be carried out in a commercially available instrument, such as an Applied Materials Quantum II. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$. Implant energies may range from about 1 keV to about 3,000 keV, such as from about 10 keV to about 3,000 keV. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate having an ion implant region therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface layer of the single crystal semiconductor donor substrate and the front surface of the single crystal semiconductor handle substrate 102, which is optionally oxidized, are next brought into intimate contact to thereby form a bonded structure. The bonded structure comprises a dielectric layer 104, e.g., a buried oxide such as silicon oxide, with a portion of the dielectric layer 104 contributed by the oxidized front surface of the single crystal semiconductor handle substrate 102 and a portion of the dielectric layer 104 contributed by the oxidized front surface of the single crystal semiconductor donor substrate. In some embodiments, the dielectric layer 104 comprises a buried oxide layer, such as a silicon oxide layer, having a thickness of at least about 10 nanometer thick, such as between about 10 nanometers and about 10,000 nanometers, between about 10 nanometers and about 5,000 nanometers, or between about 100 nanometers and about 400 nanometers.

Since the mechanical bond is relatively weak, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate 102 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 108, preferably a silicon device layer, on the semiconductor-on-insulator composite structure 100. See FIG. 3D.

After cleaving, the cleaved structure may be subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer 108 may be brought to the desired thickness and smoothness by subjecting to a vapor phase HCl etch process in a horizontal flow single wafer epitaxial reactor using $H_2$ as a carrier gas. In some embodiments, an epitaxial layer may be deposited on the transferred single crystal semiconductor device layer 108. The finished SOI wafer comprises the semiconductor handle substrate 102 comprising a nanovoid region 106, the dielectric layer 104 (e.g., buried oxide layer), and the semiconductor device layer 108, may then be subjected to end of line metrology inspections and cleaned a final time using typical SC1-SC2 process.

Figure 3D:
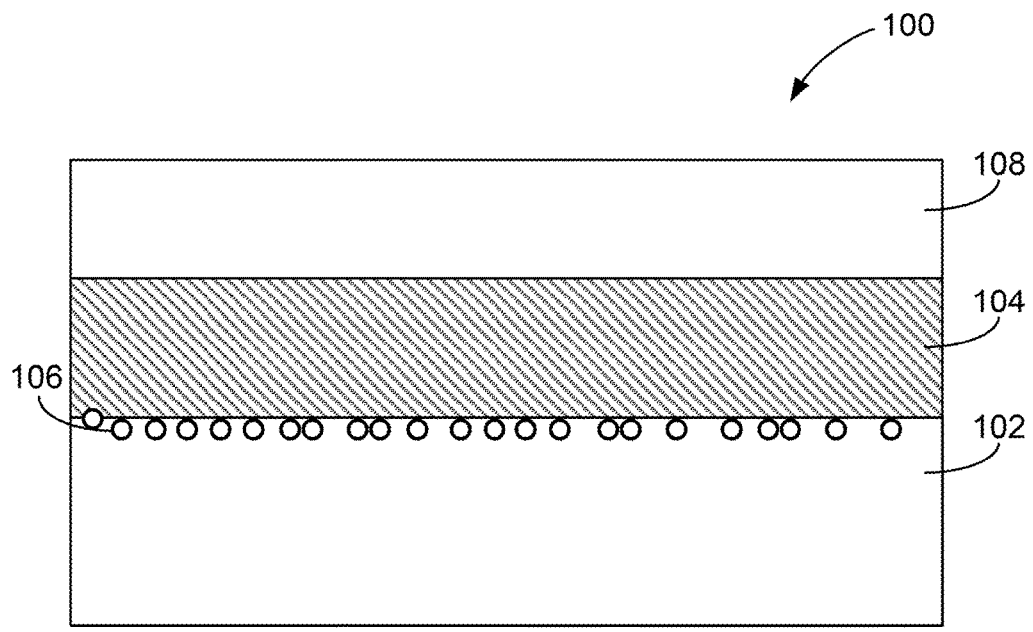

With reference to FIG. 3D, according to the present invention, semiconductor-on-insulator wafers (e.g., silicon-on-insulator) 100 are obtained comprising a high resistivity single crystal semiconductor handle substrate 102, a semiconductor oxide (e.g., silicon dioxide) layer 104, and a single crystal semiconductor device layer (e.g., silicon device layer) 108. A region of $N_2$-reacted nanovoids 106 is formed at the interface of the high resistivity single crystal semiconductor handle substrate 102 and the semiconductor oxide (e.g., silicon dioxide) layer 104. The nanometer-size voids at the interface of the high resistivity single crystal semiconductor handle substrate 102 and the semiconductor oxide (e.g., silicon dioxide) layer 104 are electrically activated deep level traps.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of forming a multilayer structure, the method comprising:

oxidizing a front surface of a single crystal semiconductor handle substrate to thereby prepare a semiconductor oxide layer having a thickness, D1, wherein the single crystal semiconductor handle substrate comprises two major, generally parallel surfaces, one of which is the front surface of the single crystal semiconductor handle substrate and the other of which is a back surface of the single crystal semiconductor handle substrate, a circumferential edge joining the front and back surfaces of the single crystal semiconductor handle substrate, a central plane between the front surface and the back surface of the single crystal semiconductor handle substrate, a front surface region having a depth, D, as measured from the front surface and toward the central plane, and a bulk region between the front and back surfaces of the single crystal semiconductor handle substrate, wherein the single crystal semiconductor handle substrate has a minimum bulk region resistivity of at least about 500 ohm-cm;

implanting He through the semiconductor oxide and the front surface of the single crystal semiconductor handle substrate to form an implant plane having a peak depth, D2, as measured from the front surface of the single crystal semiconductor substrate toward the central plane;

implanting $N_2$ through the semiconductor oxide and the front surface of the single crystal semiconductor handle substrate to form an implant plane having a peak depth, D3, as measured from the front surface of the single crystal semiconductor substrate toward the central plane;

heating the He and $N_2$ implanted single crystal semiconductor handle substrate at a temperature and a duration sufficient to out-diffuse He and thereby yield nanovoids in the front surface region of the single crystal semiconductor handle substrate; and bonding a dielectric layer on a front surface of a single crystal semiconductor donor substrate to the semiconductor oxide layer of the single crystal semiconductor handle substrate to thereby form a bonded structure, wherein the single crystal semiconductor donor substrate comprises two major, generally parallel surfaces, one of which is the front surface of the semiconductor donor substrate and the other of which is a back surface of the semiconductor donor substrate, a circumferential edge joining the front and back surfaces of the semiconductor donor substrate, and a central plane between the front and back surfaces of the semiconductor donor substrate, and further wherein the front surface of the semiconductor donor substrate comprises the dielectric layer.

2. The method of claim 1 wherein the single crystal semiconductor handle substrate comprises silicon, and the semiconductor oxide comprises silicon dioxide.

3. The method of claim 1 wherein the single crystal semiconductor handle substrate comprises a silicon wafer sliced from a single crystal silicon ingot grown by the Czochralski method or the float zone method, and the semiconductor oxide comprises silicon dioxide.

4. The method of claim 1 wherein the single crystal semiconductor handle substrate has a bulk resistivity between about 500 Ohm-cm and about 100,000 Ohm-cm.

5. The method of claim 1 wherein the single crystal semiconductor handle substrate has a bulk resistivity between about 1000 Ohm-cm and about 100,000 Ohm-cm.

6. The method of claim 1 wherein the single crystal semiconductor handle substrate has a bulk resistivity between about 1000 Ohm-cm and about 10,000 Ohm-cm.

7. The method of claim 1 wherein the single crystal semiconductor handle substrate has a bulk resistivity between about 2000 Ohm-cm and about 10,000 Ohm-cm.

8. The method of claim 1 wherein the single crystal semiconductor handle substrate has a bulk resistivity between about 3000 Ohm-cm and about 10,000 Ohm-cm.

9. The method of claim 1 wherein the single crystal semiconductor handle substrate has a bulk resistivity between about 3000 Ohm-cm and about 5,000 Ohm-cm.

10. The method of claim 1 wherein the front surface region comprises nanovoids at a surface density of at least about $1 \times 10^{12}$ nitrogen-reacted nanovoids/cm$^2$.

11. The method of claim 1 wherein the front surface region comprises nanovoids at a surface density between about $1\times10^{12}$ nitrogen-reacted nanovoids/cm$^2$ and about $1\times10^{15}$ nitrogen-reacted nanovoids/cm$^2$.

12. The method of claim 1 wherein the front surface region comprises nanovoids at a surface density between about $1\times10^{13}$ nitrogen-reacted nanovoids/cm$^2$ and about $1\times10^{13}$ nitrogen-reacted nanovoids/cm$^2$.

13. The method of claim 1 wherein the single crystal semiconductor donor substrate comprises a silicon wafer sliced from a single crystal silicon ingot grown by the Czochralski method or the float zone method.

14. The method of claim 1 wherein the dielectric layer comprises a material selected from the group consisting of silicon dioxide, silicon nitride, hafnium oxide, titanium oxide, zirconium oxide, lanthanum oxide, barium oxide, and a combination thereof.

15. The method of claim 1 wherein the dielectric layer comprises a buried oxide layer having a thickness of at least about 10 nanometer thick, such as between about 10 nanometers and about 10,000 nanometers, between about 10 nanometers and about 5,000 nanometers, or between about 100 nanometers and about 400 nanometers.

16. The method of claim 1 wherein the dielectric layer comprises silicon dioxide.

17. The method of claim 16 wherein the silicon dioxide has a thickness of at least about 10 nanometer thick, such as between about 10 nanometers and about 10,000 nanometers, between about 10 nanometers and about 5,000 nanometers, or between about 100 nanometers and about 400 nanometers.

18. The method of claim 1 further comprising heating the bonded structure at a temperature and for a duration sufficient to strengthen the bond between the dielectric layer of the semiconductor donor structure and the semiconductor oxide on the front surface of the single semiconductor handle substrate.

19. The method of claim 1 wherein the single crystal semiconductor donor substrate comprises an ion implanted damage layer.

20. The method of claim 19 further comprising mechanically cleaving the bonded structure at the ion implanted damage layer of the single crystal semiconductor donor substrate to thereby prepare a cleaved structure comprising the single crystal semiconductor handle substrate, the semiconductor oxide layer, the dielectric layer in contact with the semiconductor oxide layer, and a single crystal semiconductor device layer with the dielectric layer.

21. The method of claim 20 further comprising heating the cleaved structure at a temperature and for a duration sufficient to strengthen the bond between the single crystal semiconductor device layer and the single crystal semiconductor handle substrate.

* * * * *